US008351615B2

(12) United States Patent
Shirakihara

(10) Patent No.: US 8,351,615 B2

(45) Date of Patent: Jan. 8, 2013

(54) IMPULSE RESPONSE PROCESSING DEVICE, REVERBERATION APPLYING DEVICE AND PROGRAM

(75) Inventor: Futoshi Shirakihara, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 576 days.

(21) Appl. No.: 12/509,324

(22) Filed: Jul. 24, 2009

(65) Prior Publication Data

US 2010/0027801 A1 Feb. 4, 2010

(30) Foreign Application Priority Data

Jul. 29, 2008 (JP) ................................ 2008-195505

(51) Int. Cl.
*H03G 3/00* (2006.01)

(52) U.S. Cl. ........................................... 381/63; 381/62

(58) Field of Classification Search .................... 381/17, 381/63, 66, 93, 94.2, 61; 84/630; 379/406.14, 379/406.05, 406.13
See application file for complete search history.

(56) References Cited

U.S. PATENT DOCUMENTS 4,731,835 A 3/1988 Futamase et al.
5,025,472 A * 6/1991 Shimizu et al. ................. 381/63
5,619,579 A * 4/1997 Ando et al. ..................... 381/63
5,727,066 A * 3/1998 Elliott et al. ...................... 381/1
5,796,845 A * 8/1998 Serikawa et al. ............... 381/18
2004/0187672 A1 9/2004 Ito
2005/0180579 A1* 8/2005 Baumgarte et al. ............. 381/63

FOREIGN PATENT DOCUMENTS

JP 05-134690 A 5/1993
JP 05-232979 A 9/1993
JP 2004-294712 A 10/2004

OTHER PUBLICATIONS

European Search Report completed Dec. 7, 2009, for EP Application No. 09009700, three pages.

* cited by examiner

*Primary Examiner* — Fan Tsang
*Assistant Examiner* — Eugene Zhao
(74) *Attorney, Agent, or Firm* — Morrison & Foerster LLP

(57) ABSTRACT

In an impulse response processing device, a waveform dividing part divides a waveform of an original impulse response into a plurality of blocks on a time axis. A time adjusting part performs a time adjustment to reduce a time difference between successive ones of the blocks. A waveform synthesizing part generates a waveform of a new impulse response by adding the blocks on the time axis after the time adjustment by the time adjusting part. Further, a windowing part performs a windowing process to multiply each block by a window function having a window width corresponding to a width of the block, a function value of the window function decreasing from a center to both ends of the block. The waveform synthesizing part generates the new impulse response using the blocks after the windowing process by the windowing part.

6 Claims, 4 Drawing Sheets

IMPULSE RESPONSE PROCESSING DEVICE, REVERBERATION APPLYING DEVICE AND PROGRAM

BACKGROUND OF THE INVENTION

1. Technical Field

The present invention relates to a technique for processing a waveform of an impulse response used to apply reverberation to a sound signal.

2. Background Technique

In a device for applying reverberation to a sound signal by a convolution operation of an impulse response, a technique for changing a reverberation time length (hereinafter, referred to as 'reverberant time') during which reverberation is continued has been conventionally proposed. For example, Patent Reference 1 discloses a technique for generating a new impulse response of a desired reverberant time by multiplying impulse responses of two types by an exponential function, respectively, and then adding (linear combining) the multiplied responses. [Patent Reference 1] Japanese Patent Application Publication No. 2004-294712

However, in the technique described in Japanese Patent Application Publication No. 2004-294712 to reduce the reverberant time by multiplying the exponential function and thus reducing the intensity of the impulse response, an amplitude of the impulse response at a rear part (around the rearmost part of the reverberant sound) after processing is excessively reduced. Therefore, a problem in which the reverberant sound lacks volume (even worse, a listener cannot listen) occurs.

SUMMARY OF THE INVENTION

In consideration of the above problem, an object of the present invention is to change the reverberant time while suppressing excessive deterioration of volume at the rear part of the reverberant sound.

To solve the above problem, an impulse response processing device according to the present invention comprises: a waveform dividing part that divides a waveform of an impulse response into a plurality of blocks on a time axis; a time adjusting part that performs a time adjustment to reduce a time difference between successive ones of the blocks; and a waveform synthesizing part that generates a waveform of a new impulse response by adding the blocks on the time axis after the time adjustment by the time adjusting part.

In the above construction, since a reverberant time is shortened by reducing the time difference between the blocks dividing the impulse response, the new impulse response can provide a shortened reverberant time while a sufficient volume is maintained up to rear parts of the blocks can be generated, as compared with a construction of reducing the reverberant time by lowering an amplitude of the impulse response.

The impulse response processing device according to an aspect of the present invention further comprises a windowing part that performs a windowing process to multiply each block by a first window function having a window width corresponding to a width of the block, a function value of the first window function decreasing toward both ends of the block, wherein the waveform synthesizing part generates the new impulse response using the blocks after the windowing process by the windowing part.

In this aspect, since the blocks after division by the waveform dividing part and then multiplication by the window function are used to generate the new impulse response, the new impulse response can provide a natural reverberant sound while the blocks are smoothly continuous.

The impulse response processing device according to another aspect of the present invention further comprises an amplitude adjusting part that performs an amplitude adjustment to adjust amplitudes of the blocks so that the amplitudes are decreased as the time difference between the blocks is reduced after the time adjustment by the time adjusting part, wherein the waveform synthesizing part generates the new impulse response using the blocks after the amplitude adjustment by the amplitude adjusting part.

In this aspect, the amplitudes of the blocks are adjusted so that the amplitude of each block is reduced as the time difference between the blocks after processing by the time adjusting part is decreased, a difference of volume between an original impulse response before processing and the new impulse response after processing can be reduced.

According to a further aspect of the present invention, the waveform dividing part divides the impulse response into the plurality of the blocks such that each block contains 2N samples of the waveform and the time difference between the successive blocks corresponds to a length of N samples where N is a natural number. Time adjusting part reduces the time difference between the blocks to N·R samples (R<1), and the amplitude adjusting part multiplies each block by a second window function. The second window function is defined by repeatedly arranging a set of N·R samples within a window width of the second window function, the set of the N·R samples containing k-th sample (k=1, 2, . . . , N·R) having a numeric value which is set in correspondence to an inverse of added values of samples selected from the first window function, the selected samples being positioned at an interval of N·R from a k-th sample of the first windowing function.

In this aspect, the blocks are multiplied by the second window function is multiplied by the blocks, wherein a numeric value of a k-th sample is set in correspondence to the inverse of an added value of samples of positions of an interval N·R based on the k-th sample of the first window function, hence the new impulse response can be generated while precisely maintaining characteristics of an impulse response before processing.

A reverberation applying device according to the present invention comprises a waveform dividing part that divides a waveform of an impulse response into a plurality of blocks on a time axis; a time adjusting part that performs a time adjustment to reduce a time difference between successive ones of the blocks; a waveform synthesizing part that generates a waveform of a new impulse response by adding the blocks on the time axis after the time adjustment by the time adjusting part; and a reverberant adding part that performs a convolution operation between the new impulse response and a sound signal to thereby apply reverberation to the sound signal.

According to the reverberation applying device of the present invention, the same operation and effect as the impulse response processing device of each of the above aspects can be achieved.

The impulse processing device according to each of the above aspects is implemented not only by hardware (electronic circuit) such as a digital signal processor (DSP) dedicated for processing of the impulse response but also by cooperation of a general-purpose operation processing device such as a central processing unit (CPU) with a program. The program according to the present invention implements, by a computer, a waveform dividing process of dividing a waveform of an impulse response into a plurality of blocks on a time axis, a time adjusting process of performing a time adjustment to reduce a time difference between successive ones of the blocks, and a waveform synthesizing process of generating a waveform of a new impulse response by adding the blocks on the time axis after the time adjustment by the time adjusting part.

According to the program of the present invention, the same operation and effect as the impulse response processing device according to each of the above aspects can be achieved. Users are provided with the program of the present invention in the form of being stored in a recording medium readable by the computer so that the program is installed by the computer. In addition, the program is provided from a server device through a communication network so that the program is installed by the computer.

DETAILED DESCRIPTION OF THE INVENTION

Figure 1:
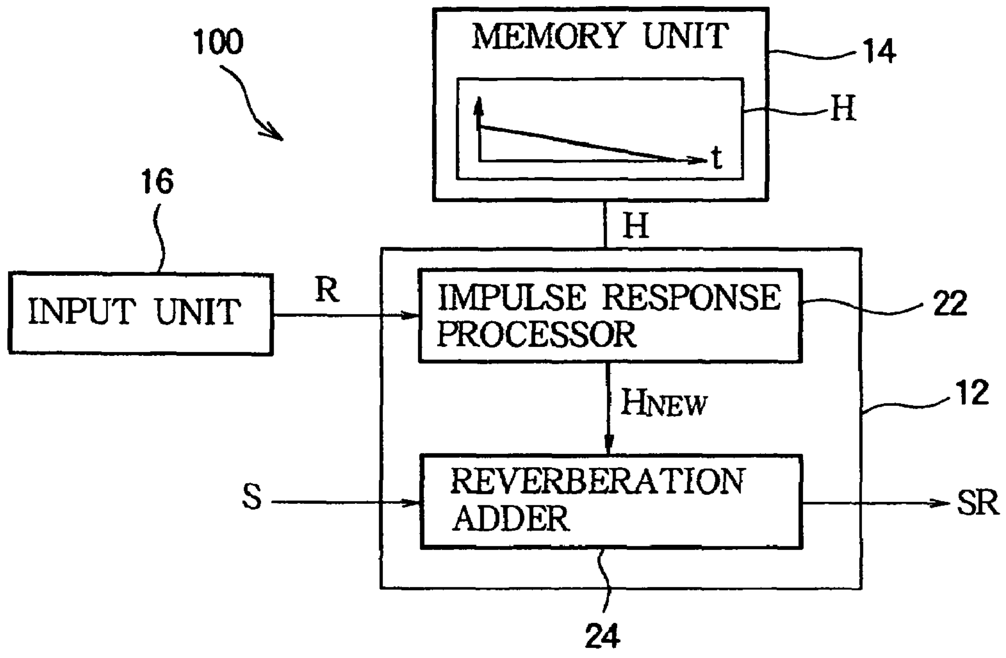
FIG. 1 is a block diagram of a reverberation applying device according to an exemplary embodiment of the present invention.

FIG. 1 is a block diagram of a reverberation applying device according to an exemplary embodiment of the present invention. A sound signal S representing a waveform of a sound (musical sound or voice) is supplied to a reverberation applying device 100. A supply source (not shown) of the sound signal S is, for example, a sound pickup device for generating the sound signal S corresponding to an ambient sound or a reproducing device for sequentially acquiring the sound signal from a recording medium and generating the sound signal S. The reverberation applying device 100 generates and outputs a reverberant sound signal SR obtained by adding a reverberant sound to the sound signal S. The reverberant sound signal SR is supplied to a speaker unit or a soundproof device (not shown) such as a set of headphones to be reproduced as sound waves.

As illustrated in FIG. 1, the reverberation applying device 12 corresponds to a computer system including an operation processing unit 12, a memory unit 14, and an input unit 16. The memory unit 14 is a machine readable medium which stores programs executed by the operation processing unit 12 and data used by the operation processing unit 12. For example, a sample series (series coefficients for convolution operations) indicating a waveform of an impulse response H is stored in the memory unit 14. A known recording medium such as a semiconductor memory unit or a magnetic memory unit is freely employed as the memory unit 14.

The operation processing unit 12 serves as a plurality of modules (an impulse response processor 22 and a reverberation adder 24) by executing a program stored in the memory unit 14. A configuration may be used in which the respective modules of the operation processing unit 12 are distributively mounted in a plurality of devices (integrated circuits) or an electronic circuit (DSP) dedicated for processing the sound signal S implements the respective modules.

The impulse response processor 22 processes the impulse response H stored in the memory unit 14 to generate a sample series indicating a waveform of another impulse response (hereinafter, referred to as "new impulse response") HNEW having a different characteristic (such as reverberant time) from the original impulse response H. The new impulse response HNEW refers to a waveform signal in which a reverberant time is reduced to R times (where 0<R<1) the original impulse response H. The reverberation adder 24 generates the reverberant sound signal SR by executing filter processing (convolution operation) with respect to the sound signal S using the new impulse response HNEW generated by the impulse response processor 22. A known technique is arbitrarily used to generate the reverberant sound signal SR by the reverberation adder 24.

The input unit 16 is comprised of an operating device operated by a user to input instructions for the reverberation applying device 100. A user may variably designate a rate (reduction rate) R of a reverberant time in correspondence to the operation of the input unit 16.

Figure 2:
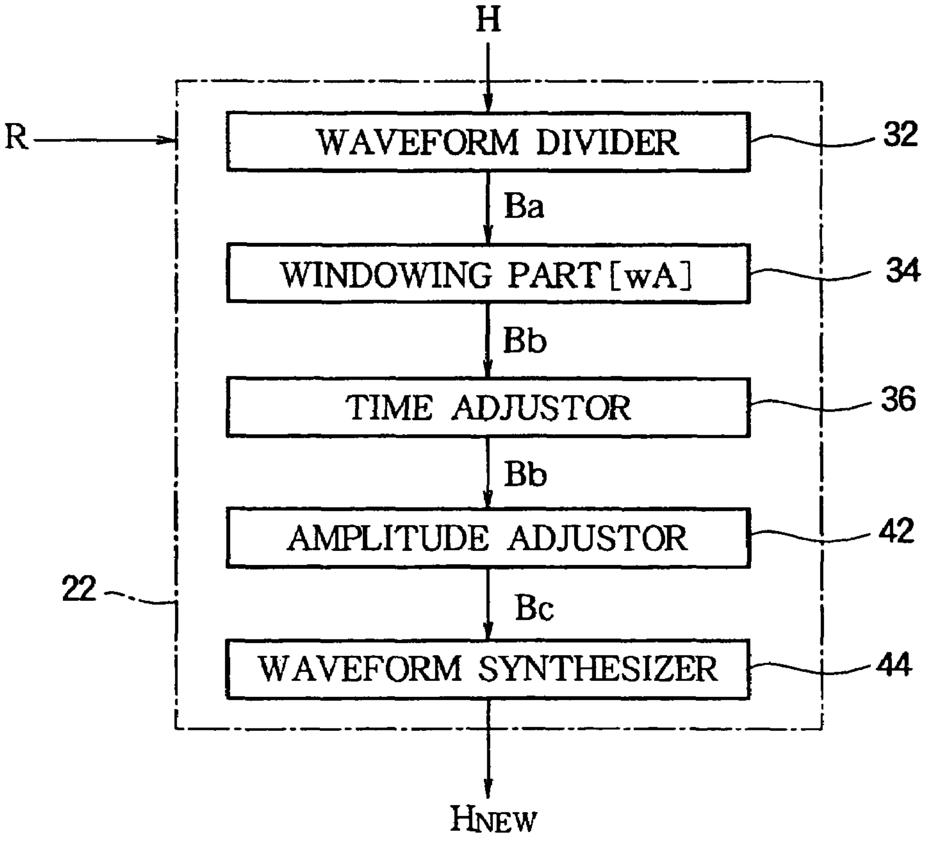
FIG. 2 is a block diagram of an impulse response processor.
Figure 3:
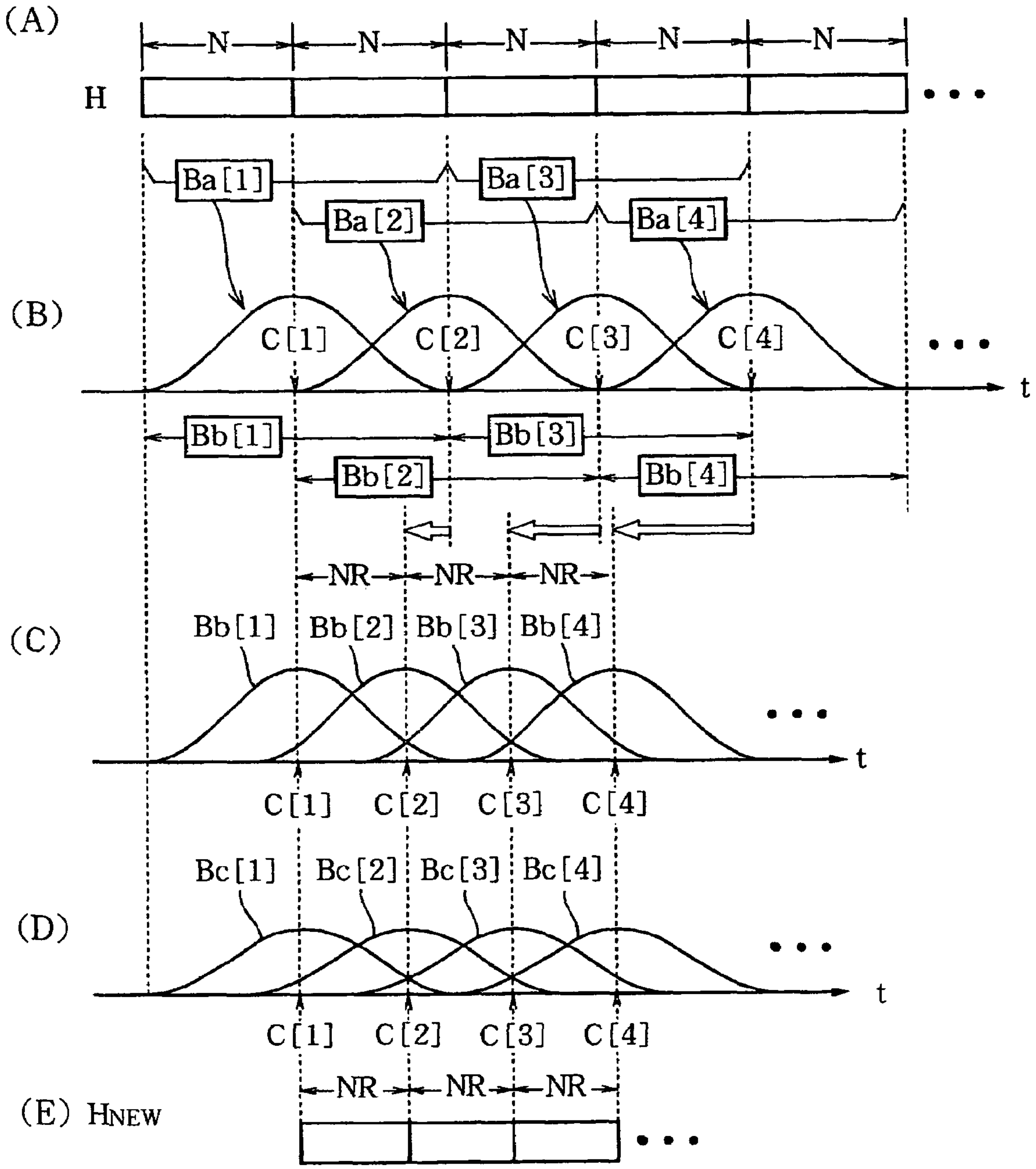
FIG. 3 is a conceptual diagram explaining an operation of an impulse response processor.

FIG. 2 is a block diagram of the impulse response processor 22. FIG. 3 is a conceptual diagram explaining detailed processing by the impulse response processor 22. As illustrated in FIG. 2, the impulse response processor includes a waveform divider 32, a windowing part 35, a time adjustor 36, an amplitude adjustor 42, and a waveform synthesizer 44.

The waveform divider 32 is a waveform dividing part that divides the impulse response H stored in the memory unit 14 into a plurality of intervals (hereinafter, referred to as 'blocks') Ba (Ba[1], Ba[2], . . . ) on a time axis. As illustrated in FIG. 3(A), each block Ba is constructed by 2N (e.g., N=64) samples of the impulse response H. A time difference between the successive blocks Ba corresponds to N samples. Accordingly, the successive blocks Ba overlap partially. In more detail, N rear samples in each block Ba[i] (i=1,2, . . . ) and N front samples in a subsequent block Ba[i+1] overlap.

The windowing part of FIG. 2 generates blocks Bb (Bb[1], Bb[2], . . . ) by multiplying a window function wA to each block Ba divided by the waveform divider 32. Each block Bb is comprised of 2N samples. A function in which a function value is decreased as the block approaches both ends thereof, ideally, a function in which a function value at both ends of the block is 0 is desirable as the window function wA. In FIG. 3(B), each block Bb obtained after multiplying the window function wA to the block Ba is schematically illustrated as a diagram showing a shape of the window function wA. In this embodiment, a Hanning window w(n) defined in Equation (1) is used as the window function WA.

$$W(n)=0.5-0.5\cos(n\pi/N). \tag{1}$$

The time adjustor 36 of FIG. 2 is a time adjusting part that shifts each block Bb after processing by the windowing part 34. The time adjustor 36 of this embodiment adjusts a position of each block Bb on a time axis so that a time difference (interval) between successive blocks Bb is reduced by a time length corresponding to the rate R from N samples (time difference immediately after division by the waveform divider 32). In more detail, as illustrated in FIG. 3(*c*), a position of each block Bb is adjusted such that an interval between a central point C[i] of the block Bb[i] on the time axis and a central point C[i+1] of a-subsequent block Bb[i+1] corresponds to a time length of N·R obtained by multiplying the rate R by a time length (time difference before position adjustment) corresponding to N samples of the impulse response H.

The amplitude adjustor 42 of FIG. 2 is an amplitude adjusting part that adjusts amplitudes of the respective blocks Bb (Bb[1], Bb[2], . . . ) after processing by the time adjustor 36, thereby generating blocks Bc (Bc[1], Bc[2], . . . ). As illustrated in FIG. 3(D), a block Bc[i] is comprised of 2N samples, a numeric value (amplitude) of each sample of the block Bb[i] being adjusted. Similarly to FIG. 3(B) or FIG. 3(C), each block Bc is schematically illustrated as a diagram showing a shape of a window function. Processing performed by the amplitude adjustor 42 will be described in detail later on.

The waveform synthesizer 44 of FIG. 2 is waveform synthesizing part that adds the blocks Bc (Bc[1], Bc[2], . . . ), as illustrated in FIG. 3(E), after the amplitude is adjusted by the amplitude adjustor 42, thereby generating a new impulse response HNEW. In more detail, the waveform synthesizer 44 adds numeric values of respective samples corresponding to the same time point with respect to the blocks Bc which overlap on the time axis. The new impulse response HNEW is a temporal sequence of added values of the samples of the blocks Bc. Accordingly, a reverberant time of the new impulse response HNEW becomes R times a reverberant time of the impulse response H. A user appropriately specifies the rate R by operating the input unit 16, so that a reverberant time of a playback sound of the reverberant sound signal SR can be freely adjusted.

However, as the time difference N·R of each block Bb after adjustment by the time adjustor 36 is decreased (i.e., as the rate R is decreased), samples having a great numeric value (amplitude) among the blocks Bb are added by the waveform synthesizer 44. Accordingly, for example, in a construction synthesizing the new impulse response HNEW by the waveform synthesizer 44 by adding the blocks Bb just after adjustment by the time adjustor 36, that is, in a construction omitting the amplitude adjustor 42, as the time difference N·R of the blocks Bb after adjustment of the time adjustor 36 is decreased (i.e., as the number of the blocks Bb overlapping on the time axis or an overlapping time length of the blocks Bb is increased), the amplitude of the new impulse response HNEW is increased as compared with the impulse response H before processing.

To suppress such a variation of the amplitude, the amplitude adjustor 42 adjusts the amplitudes of the blocks Bb so that as the time difference N·R of the blocks Bb after adjustment by the time adjustor 36 is decreased (i.e., as the number of the blocks Bb overlapping on the time axis is increased), the amplitude is decreased, thereby generating the blocks Bc. The amplitude adjustor 42 of this embodiment generates the blocks Bc[i] by multiplying a second window function wB to the blocks Bb[i]. The second window function wB is a sequence of 2N samples which are set in correspondence to the first window function wA and in accordance to the rate R. Hereinafter, a method for setting the window function wB will be described.

Figure 4:
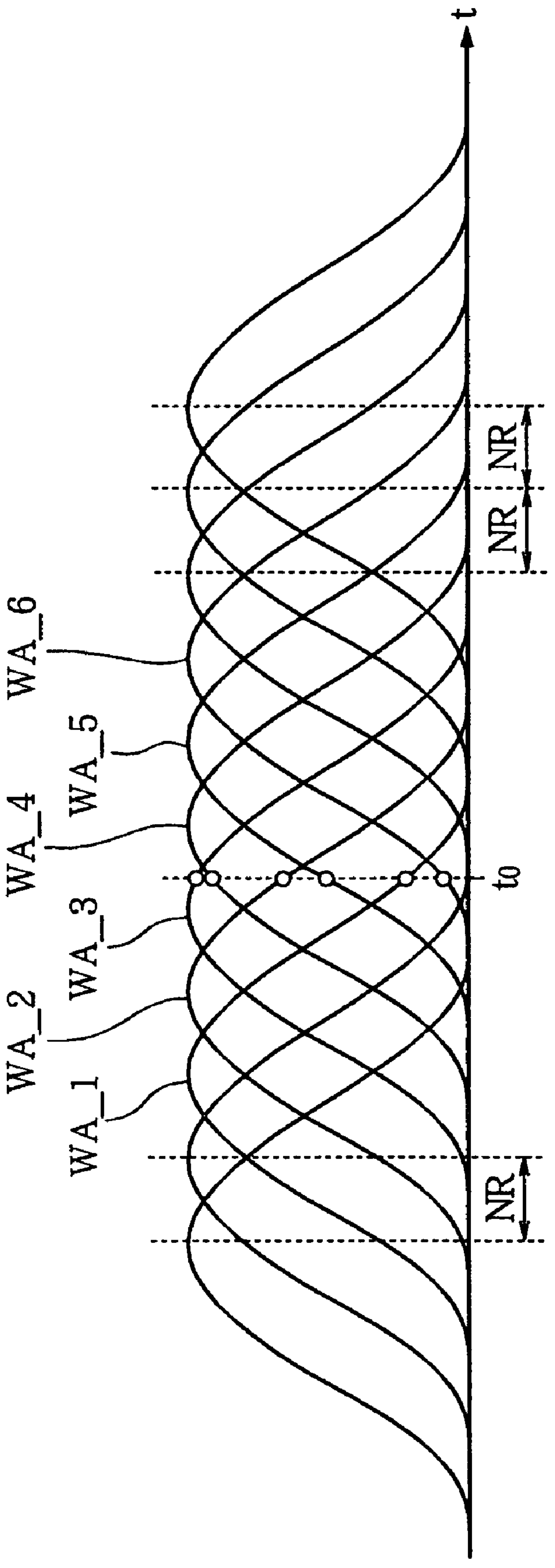
FIG. 4 is a conceptual diagram explaining a relationship between a plurality of window functions.

FIG. 4 illustrates a plurality of window functions wA arranged with a time difference N·R on a time axis. Namely, FIG. 4 shows amplitudes of the blocks Bb after adjustment by the time adjustor 36 when it is assumed that all samples of the blocks Bb have a common numeric value (e.g., '1'). As illustrated in FIG. 4, a plurality of window functions wA (wA_1 to wA_6) overlap at a time point t0 on the time axis.

Figure 5:
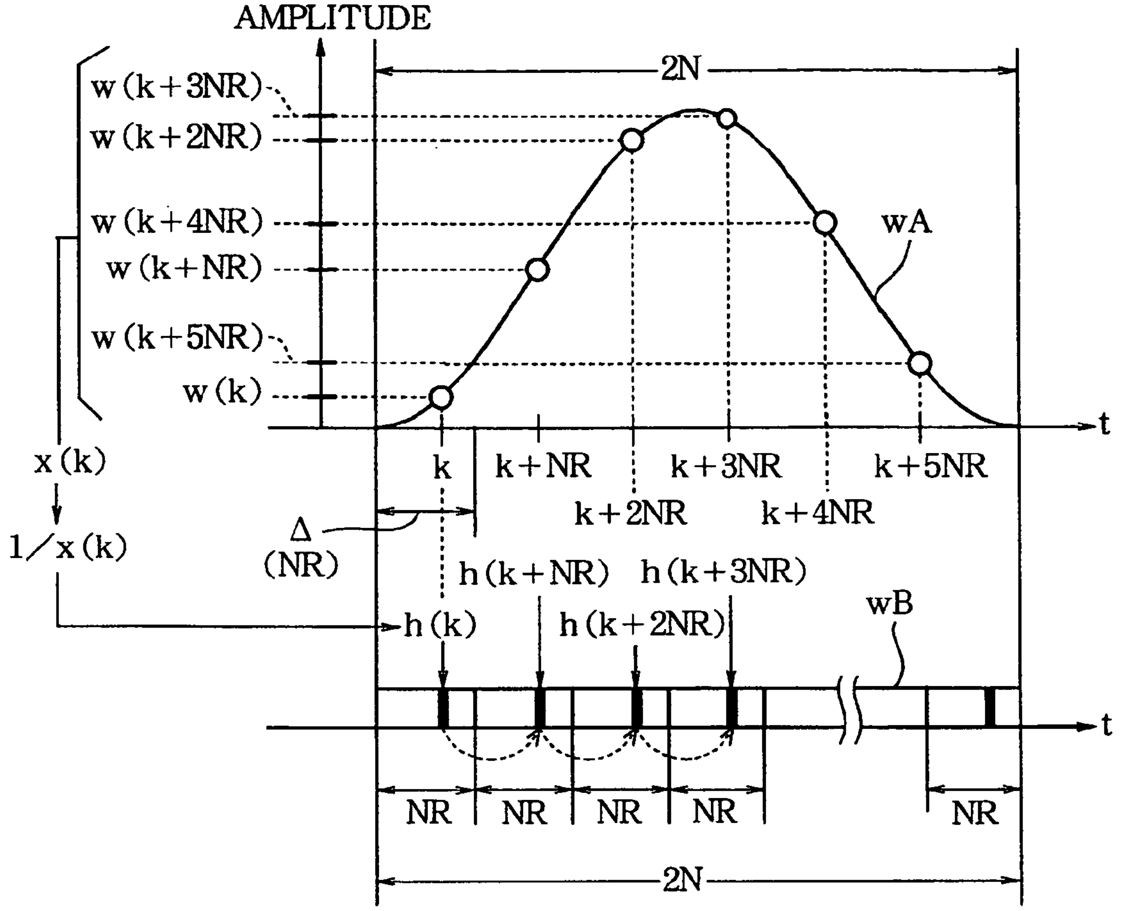
FIG. 5 is a conceptual diagram explaining an operation of an amplitude adjustor.
Figure 6:
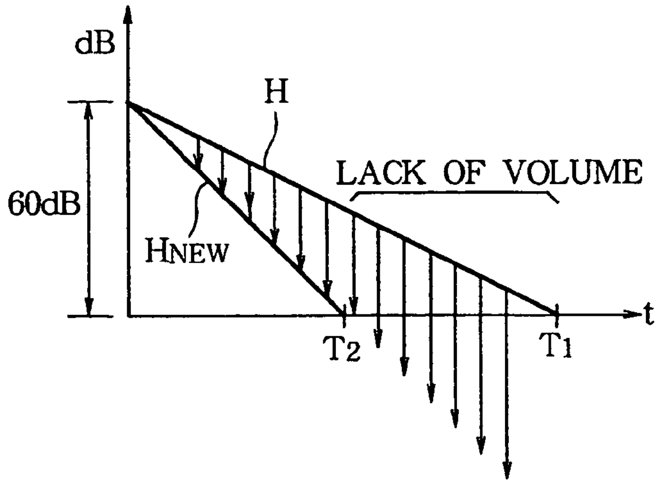
FIG. 6 is a conceptual diagram explaining processing of an impulse response in a comparative example.

If the plurality of window functions wA (wA_1 to wA_6) overlapping at the time point t0 is shifted along the time axis such that waveforms of the window functions wA_1 to wA_6 are identical, numeric values of samples of the window function wA at the time point t0 shown in FIG. 4 correspond to numeric values w(k), w(k+N·R), w(k+2N·R), . . . of samples extracted at an interval N·R from the 2N samples of one window function wA as illustrated in FIG. 5. Therefore, assuming that a sample corresponding to the time point t0 of FIG. 4 among (N·R) samples (samples within an interval Δ of FIG. 5) by counting from a time point of the window function wA is a K-th sample (k=1, 2, . . . , N·R), an added value x(k) of overlapping samples at the time point t(0) of FIG. 4 is expressed by the following equation (2).

$$x(k) = w(k) + w(k+N\cdot R) + w(k+2N\cdot R) + w(k+3N\cdot R) + \ldots + w(k+\alpha(k)\cdot N\cdot R) \quad (2)$$

In Equation (2), a coefficient α(k) is selected in correspondence to a numeric value k such that 'k+α(k)·N·R' is within a range of a window width 2N of the window function wA (i.e., k+α(k)·N·R<2N).

Since the window function wA is arranged periodically with a time difference N·R, an added value x(k) of the samples of the window function wA is repeated periodically on the time axis in units of the time length N·R. Therefore, the following Equation (3) is satisfied.

$$x(k)=x(k+N\cdot R)=x(k+2N\cdot R)=x(k+3\ N\cdot R)=. \quad (3)$$

To suppress an increase of the amplitude of the new impulse response HNEW caused by the summation of a plurality of blocks overlapping on the time axis (i.e., the sum of a plurality of window functions wA), each numeric value of 2N samples of the window function wB obtained by multiplying the each block Bb by the amplitude adjustor 42 is set in correspondence to the inverse of the added value x(k) of the samples of the overlapping window functions wA. In more detail, a numeric value h(k) of each of the first to (N·R) samples is set by the inverse 1/x(k) of the added value x(k) of Equation (2) as follows.

$$\begin{aligned} h(1) &= 1/x(1) \\ &= 1/\{w(1) + w(1+N\cdot R) + w(1+2N\cdot R) + \ldots + w(1+\alpha(1)\cdot N\cdot R)\} \\ h(2) &= 1/x(2) \\ &= 1/\{w(2) + w(2+N\cdot R) + w(2+2N\cdot R) + \ldots + w(2+\alpha(2)\cdot N\cdot R)\} \\ h(N\cdot R) &= 1/x(N\cdot R) \\ &= 1/\{w(N\cdot R) + w(2N\cdot R) + w(3N\cdot R) + \ldots + w((1+\alpha(NR))\cdot N\cdot R)\} \end{aligned}$$

Furthermore, as indicated by Equation 3, the added value x(k) is repeated periodically, each sample of the window function wB satisfies the following Equation 4.

$$h(k)=h(k+N\cdot R)=h(k+2N\cdot R)=h(k+3N\cdot R)= \quad (4)$$

That is, as illustrated in FIG. 5, the window function wB (set of the first to (2N)-th samples) is set by repeatedly connecting a set of (N·R) samples h(1) to h(N·R) from the first to (N·R)-th samples along the time axis.

Since the block Bc[i] is generated by multiplying the window function wB set as described above by the block Bb[i], the new impulse response HNEW is adjusted to have the same amplitude as the original impulse response H before processing by adding the blocks Bb after reduction of the time difference despite a construction of generating the new impulse response HNEW.

Next, a construction of shortening a reverberant time by multiplying an exponential function by the impulse response H will be described as a comparative example with this embodiment. In the comparative example, the new impulse response HNEW is generated by multiplying an exponential function a(t) by the impulse response H as defined in Equation (5). In the comparative example, a reduction rate of the amplitude of the new impulse response HNEW to the amplitude (intensity) of the original impulse response H is exponentially increased at a rear part of the impulse response H. Accordingly, volume is low especially at the rear part (around the rearmost part) of a reverberant sound of the new impulse response.

$$H_{NEW} = a(t) \cdot H \tag{5}$$

$$a(t) = 10^{3\left(\frac{1}{T_1} - \frac{1}{T_2}\right)t}$$

In this embodiment in contrast with the comparative example, the amplitude of the impulse response H is not reduced in correspondence to the rate R while a time difference between the multiple blocks Ba (Bb) dividing the impulse response H is reduced (by compressing the impulse response H in the direction of the time axis), thereby shortening a reverberant time. Thus, a problem generated in the comparative example, that is, lack of volume of the reverberant sound of the new impulse response HNEW is effectively prevented. Further, since a numeric value of a sample is decreased as the block Bb generated by multiplication of the window function wA approaches both ends thereof, the blocks Bc are successively connected on the time axis. Therefore, compared with the case where the intensity of the new impulse response HNEW is discontinuous at an end part of each block Bc, the new impulse response HNEW which may generate a natural reverberant sound can be synthesized.

MODIFIED EXAMPLE

The above exemplary embodiment may be modified in various ways. Aspects of a detailed modification are as follows. Two or more aspects may be selectively combined from the following examples.

(1) Modified Example 1

A sequence (time point) by which the window function wA or wB is multiplied is appropriately changed. For example, a construction in which each block Bb is multiplied by the window function wA by the windowing part 34 after adjustment by the time adjustor 36 or a construction in which each block Ba is multiplied by the window function wB by the amplitude adjustor 42 before adjustment by the time adjustor 36 (before or after multiplication of the window function wA) is used.

(2) Modified Example 2

Content of the window function wA is diverse. Various known window functions (e.g., Hamming window or triangle window) may be used as the window function wA. Content of the window function wB is appropriately changed according to the window function wA. However, a construction using the window function wA to set the window function wB is not indispensable in the present invention.

(3) Modified Example 3

Multiplication (windowing part 34) of the window function wA is omitted. For example, a construction is employed in which the time difference between the blocks Ba divided by the waveform divider 32 is reduced by the time adjustor 36 and then the blocks Ba are added by the waveform synthesizer 44 to generate the new impulse response HNEW. Accordingly, partial overlap of the blocks Ba is not indispensable in the present invention.

In a construction in which the window function wA is not used, although sound quality is deteriorated by discontinuity of a reverberant sound at an overlapping part of the blocks, the discontinuity of the reverberant sound can be reduced by a method (e.g, by suppression of a high sound band in the reverberant sound) other than multiplication of the window function wA. In this case, a construction is desirable in which the window function wA is multiplied after the blocks are divided such that the blocks partially overlap to naturally connect the blocks Bb while precisely maintaining sound characteristics of the impulse response H.

Multiplication (amplitude adjustor 42) of the window function wB is not indispensable in the present invention. For example, in a construction in which the window function wA is not used, the window function wB is omitted. Even if the window function wA is used, the window function wB may be omitted. As described in the above embodiment, although the amplitude of the new impulse response HNEW is increased in comparison with the original impulse response H by adding the blocks Ba after multiplication of the window function wA, if the volume of the reverberant sound is deteriorated by a method (e.g., suppression of the amplitude of the reverberant sound signal SR) other than the multiplication of the window function wB, an influence of an increase of the amplitude of the new impulse response HNEW is reduced. In this case, a construction is desirable in which the window function wA, and the window function wB corresponding to the rate R are multiplied to generate the new impulse response HNEW while precisely maintaining sound characteristics of the impulse response H.

(4) Modified Example 4

In the above embodiment, although the reverberation applying device 100 including the impulse response processor 22 and the reverberation adder 24 is exemplarily described, an impulse response processing device (impulse response processor 22) omitting the reverberation adder 24 from the reverberation applying device 100 of FIG. 1 may be utilized. The new impulse response HNEW generated by the impulse response processing device is used to generate a reverberant sound by being provided to an additional reverberation applying device 100 (reverberation adder 24) through a portable recording medium or a communication network.

The invention claimed is:

1. An impulse response processing device comprising:

a waveform dividing part that divides a waveform of an impulse response into a plurality of blocks on a time axis;

a time adjusting part that performs a time adjustment to reduce a time difference between successive ones of the blocks; and a waveform synthesizing part that generates a waveform of a new impulse response by adding the blocks on the time axis after the time adjustment by the time adjusting part.

2. The impulse response processing device according to claim 1, further comprising a windowing part that performs a windowing process to multiply each block by a first window function having a window width corresponding to a width of the block, a function value of the first window function decreasing toward both ends of the block, wherein the waveform synthesizing part generates the new impulse response using the blocks after the windowing process by the windowing part.

3. The impulse response processing device according to claim 2, further comprising an amplitude adjusting part that performs an amplitude adjustment to adjust amplitudes of the blocks so that the amplitudes are decreased as the time difference between the blocks is reduced after the time adjustment by the time adjusting part, wherein the waveform synthesizing part generates the new impulse response using the blocks after the amplitude adjustment by the amplitude adjusting part.

4. The impulse response processing device according to claim 3, wherein the waveform dividing part divides the impulse response into the plurality of the blocks such that each block contains 2N samples of the waveform and the time difference between the successive blocks corresponds to a length of N samples where N is a natural number, wherein the time adjusting part reduces the time difference between the blocks to NR samples (R<1), and the amplitude adjusting part multiplies each block by a second window function, and wherein the second window function is defined by repeatedly arranging a set of NR samples within a window width of the second window function, the set of the NR samples containing k-th sample (k=1, 2,. . . , NR) having a numeric value which is set in correspondence to an inverse of added values of samples selected from the first window function, the selected samples being positioned at an interval of NR from a k-th sample of the first windowing function.

5. A reverberation applying device comprising:

a waveform dividing part that divides a waveform of an impulse response into a plurality of blocks on a time axis;

a time adjusting part that performs a time adjustment to reduce a time difference between successive ones of the blocks;

a waveform synthesizing part that generates a waveform of a new impulse response by adding the blocks on the time axis after the time adjustment by the time adjusting part; and a reverberant adding part that performs a convolution operation between the new impulse response and a sound signal to thereby apply reverberation to the sound signal.

6. A non-transitory machine readable recording medium containing a program which is executed by a computer to perform:

a waveform dividing process of dividing a waveform of an impulse response into a plurality of blocks on a time axis;

a time adjusting process of performing a time adjustment to reduce a time difference between successive ones of the blocks; and a waveform synthesizing process of generating a waveform of a new impulse response by adding the blocks on the time axis after the time adjustment by the time adjusting part.

* * * * *